(12) United States Patent
Toshioka et al.

(10) Patent No.: US 7,736,541 B2
(45) Date of Patent: Jun. 15, 2010

(54) ANISOTROPIC CONDUCTIVE ADHESIVE

(75) Inventors: Hideaki Toshioka, Kanagawa (JP); Masamichi Yamamoto, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/992,790

(22) PCT Filed: Sep. 26, 2006

(86) PCT No.: PCT/JP2006/319027

§ 371 (c)(1), (2), (4) Date: Mar. 28, 2008

(87) PCT Pub. No.: WO2007/040090

PCT Pub. Date: Apr. 12, 2007

(65) Prior Publication Data

US 2009/0140210 A1    Jun. 4, 2009

(30) Foreign Application Priority Data

Sep. 30, 2005  (JP) .............................. 2005-285721

(51) Int. Cl.
 H01B 1/00 (2006.01)
 H01B 1/20 (2006.01)
 H01B 1/22 (2006.01)

(52) U.S. Cl. ................. 252/500; 252/502; 252/511; 252/512; 252/513; 252/514; 252/518.1; 428/343; 428/413

(58) Field of Classification Search .......... 252/500, 252/502, 511, 512, 513, 514, 518.1; 428/137, 428/343, 413
See application file for complete search history.

(56) References Cited

U.S. PATENT DOCUMENTS

| 6,452,111 | B1* | 9/2002 | Kumakura | 174/259 |
| 6,780,898 | B2* | 8/2004 | Kumakura | 522/168 |
| 7,247,381 | B1* | 7/2007 | Watanabe et al. | 428/413 |
| 2003/0141014 | A1* | 7/2003 | Satoyuki et al. | 156/326 |
| 2006/0113511 | A1* | 6/2006 | Chen | 252/500 |
| 2007/0054114 | A1* | 3/2007 | Kumakura | 428/343 |
| 2007/0055039 | A1* | 3/2007 | Usui et al. | 528/123 |
| 2007/0175579 | A1* | 8/2007 | Otani et al. | 156/241 |
| 2007/0212521 | A1* | 9/2007 | Bessho et al. | 428/137 |
| 2007/0215838 | A1 | 9/2007 | Toshioka et al. | |

FOREIGN PATENT DOCUMENTS

| EP | 1 628 363 A | | 2/2006 |
| JP | 07-216329 | * | 8/1995 |
| JP | 08-315885 | | 11/1996 |
| JP | 2000-204324 | | 7/2000 |
| JP | 2002-201450 | | 4/2002 |
| JP | 2002-201449 | | 7/2002 |
| JP | 2002-203871 | | 7/2002 |
| JP | 2002-204052 | | 7/2002 |
| JP | 2003-253231 | | 9/2003 |
| JP | 2004-220916 | | 8/2004 |
| JP | 2004-331728 | | 11/2004 |
| JP | 2005-290241 | | 10/2005 |
| WO | WO 2005/023954 A1 | | 3/2005 |
| WO | WO2005026279 | * | 3/2005 |
| WO | WO 2006/064678 A1 | | 6/2006 |

OTHER PUBLICATIONS

Database WPI Week 200524, Thomson Scientific, London, GB; AN 2005-233276; XP002560345.
European Search Report issued in European Patent Application No. EP 06 81 0552.7 dated Dec. 28, 2009.

* cited by examiner

*Primary Examiner*—Harold Y Pyon
*Assistant Examiner*—Haidung D Nguyen
(74) *Attorney, Agent, or Firm*—McDermott Will & Emery LLP

(57) ABSTRACT

An anisotropic conductive adhesive is provided that includes an epoxy resin, a phenoxy resin, a curing agent, an inorganic filler, and conducting particles as components. The phenoxy resin is controlled to have a glass-transition temperature (Tg) in a range of 66° C. to 100° C., so that the anisotropic conductive adhesive has an excellent fluidity in a mounting process, satisfactory electric conductive/insulation performances, and sufficient adhesiveness. Since the properties of the anisotropic conductive adhesive are almost invariant even if the adhesive is used for a long time under a high-temperature- and high-humidity condition, the anisotropic conductive adhesive can be used for applications where a high reliability is required.

5 Claims, No Drawings

ANISOTROPIC CONDUCTIVE ADHESIVE

RELATED APPLICATIONS

This application is the U.S. National Phase under 35 U.S.C. §371 of International Application No. PCT/JP2006/319027, filed on Sep. 26, 2006, which in turn claims the benefit of Japanese Application No. 2005-285721, filed on Sep. 30, 2005, the disclosures of which Applications are incorporated by reference herein.

TECHNICAL FIELD

The present invention relates to an anisotropic conductive adhesive for bonding and electrically connecting electronic components or the like to a board having electrodes and circuits thereon.

BACKGROUND ART

In recent years, terminals provided in components constituting electronic equipment have become smaller under trends of miniaturization and functional enhancement of the electronic equipment. Therefore, in a technical area of electronic mounting, various kinds of anisotropic conductive adhesives have been widely used to easily connect such terminals together. For example, anisotropic conductive adhesives are used to bond integrated circuit chips to a flexible printed circuit board (FPC) or to a glass substrate having an indium-tin-oxide (ITO) electrode circuit formed thereon.

The anisotropic conductive adhesive is a film type adhesive or a paste type adhesive, which includes conducting particles that are dispersed in an insulative resin composition. The anisotropic conductive adhesive is provided between objects so as to bond the objects by heating and pressing. When heated or pressed, a resin in the adhesive flows into a gap between objects so as to seal the space between electrodes facing each other disposed on the objects. Some conducting particles in the resin also flow into the space between the electrodes facing each other so as to achieve an electrical connection therebetween. The anisotropic conductive adhesive is desired to provide a conduction performance in which low resistance (connection resistance) is exhibited between electrodes facing each other in the thickness direction and an insulation performance in which high resistance (insulation resistance) is exhibited between electrodes being adjacently disposed in the lateral direction.

As examples of insulative resin compositions constituting the anisotropic conductive adhesive, epoxy-type thermosetting resin compositions are mainly used. For example, resin compositions containing a curing agent and thermosetting resins such as an epoxy resin and a phenoxy resin are widely used.

The anisotropic conductive adhesive is desired to have high reliability in a connected portion because it is used to connect peripheral components involved in precision apparatuses such as a liquid crystal display (LCD). Therefore, environment-resistant characteristics are desired as well as conduction/insulation performances. The performances are evaluated by a high-temperature-and-high-humidity test or a thermo-cycle test, for example. Note here that the epoxy-type resin composition contained in the anisotropic conductive adhesive has some problems in terms of moisture resistance. That is, since the epoxy-type resin composition includes a hydroxyl group in its molecules, the epoxy-type resin shows high water absorption and poor connections may occur under a high-temperature-and-high-humidity test. Furthermore, since the resin composition has high coefficient of thermal expansion compared with a board material, under a thermo-cycle test, the connection resistance at a connected portion may be increased by the stress occurring due to a difference in coefficient of thermal expansion between a board and the adhesive.

In order to improve the thermal resistance and moisture resistance of the adhesive, Patent document 1 discloses adhesive compositions each having a phenoxy resin, naphthalene-type epoxy resin, and a latent curing agent as critical components. By using a naphthalene-type epoxy resin as an epoxy resin, a glass-transition temperature (Tg) of a cured resin can be raised. Furthermore, in order to reduce the coefficient of thermal expansion and to improve the moisture resistance, a method of adding an inorganic filler to resin compositions has been proposed. Patent document 2 discloses epoxy resin sheet-shaped adhesive compositions each having an epoxy resin, a latent curing agent, an inorganic filler, and polyethersulfone. The disclosed adhesive compositions contain 5 to 900 parts by weight of the inorganic filler per 100 parts by weight of total amount of the epoxy resin, the latent curing agent, and the polyethersulfone.

Patent Document 1: Japanese Unexamined Patent Application Publication No. 8-315885

Patent Document 2: Japanese Unexamined Patent Application Publication No. 2000-204324

DISCLOSURE OF INVENTION

Problems to be Solved by the Invention

Generally, in order to improve the thermal and moisture resistances, it is necessary that the glass-transition temperature (Tg) of the cured resin component that is contained in the anisotropic conductive adhesive be raised to a high temperature. This is because if the glass-transition temperature (Tg) is high, the coefficient of thermal expansion in a high temperature range is suppressed, so that the characteristics of the anisotropic conductive adhesive come to show stability under a high temperature and high humidity environment.

A phenoxy resin having a high glass-transition temperature (Tg) is used as the resin component in order to raise the glass-transition temperature (Tg) of the cured resin component. It was found, however, that if the phenoxy resin having a high glass-transition temperature (Tg) is used, a connection reliability of the anisotropic conductive adhesive is lowered. Although the anisotropic conductive adhesive disposed between objects can bond the objects together under heating and pressing, since the phenoxy resin having the high glass-transition temperature (Tg) does not have a sufficient fluidity if heated and pressed, poor connections may occur due to an insulation film formed by the cured resin component that unnecessarily remains at gaps between electrodes disposed on the objects. Recently, in particular, bonding under lower temperature and lower pressure has been desired. Therefore, in order to keep high reliability of connection under such a condition, a sufficient fluidity is needed.

An object of the present invention is to solve the above-mentioned problems and to provide an anisotropic conductive adhesive capable of controlling thermal expansion under high temperature and high humidity conditions and improving stability of connection, without losing fundamental properties such as adhesiveness and conduction/insulation performances.

Means for Solving the Problems

The present inventors found after intensive research that the above-mentioned problems can be solved by an adhesive containing an epoxy resin, a phenoxy resin, a curing agent, an inorganic filler, and conducting particles as essential components, wherein the glass-transition temperature (Tg) of the phenoxy resin is optimized, resulting in the completion of the present invention.

The present invention relates to an anisotropic conductive adhesive including an epoxy resin, a phenoxy resin, a curing agent, an inorganic filler, and conducting particles as components. The glass-transition temperature (Tg) of the phenoxy resin is 66° C. to 100° C. (a first invention of the present application).

By using a phenoxy resin having a relatively low glass-transition temperature (Tg), the fluidity of a resin component can be increased, and as a result, stability of connection can be improved.

The phenoxy resin used in the present invention is an epoxy resin with a high molecular weight. In the present invention, a high molecular weight means an average molecular weight of 10,000 or more. Note that an average molecular weight of a resin is determined by gel permeation chromatography (GPC) of the resin dissolved in THF and expressed in terms of polystyrene standard. The phenoxy resin is used to improve film formability of the anisotropic conductive adhesive. The average molecular weight of the phenoxy resin is preferably in the range of 10,000 to 150,000, and more preferably, in the range of 10,000 to 80,000.

It is necessary that the glass-transition temperature (Tg) of the phenoxy resin be 66° C. to 100° C. If the Tg of the phenoxy resin is lower than 66° C., the Tg of the cured anisotropic conductive adhesive is decreased and thermal and moisture resistances are lowered. If the Tg of the phenoxy resin exceeds 100° C., since the resin component does not have a sufficient fluidity under heating and pressing to form a connection, poor connections may be caused due to formation of an insulation layer by a cured resin component that unnecessarily remains at a gap between electrodes serving as connections. Note that the glass-transition temperature (Tg) can be determined by differential scanning calorimetry (DSC).

The content of phenoxy resin is preferably 5 wt % to 60 wt % of the total amount of the resin components. A second invention of the present application corresponds to this preferable aspect. If the content of the phenoxy resin is less than 5 wt %, problems occur in film formation. If the content of the phenoxy resin exceeds 60 wt %, the resin may be insufficiently cured since a curing rate is lowered. More preferably, the content of the phenoxy resin is 10 wt % to 40 wt %. Note that the resin components mentioned here include thermosetting resins such as a phenoxy resin and an epoxy resin or a thermoplastic resin such as a phenoxy resin.

The epoxy resin used in the present invention immediately reacts with the curing agent when heated and develops adhesiveness. The kind of the epoxy resin is not particularly limited. Examples of the epoxy resin include novolac-type, biphenyl-type, and dicyclopentadiene-type epoxy resins as well as bisphenol-type epoxy resins having bisphenol of an A, F, S, or AD type structure. The molecular weight of the epoxy resin can be properly selected taking into the account the properties desired for the anisotropic conductive adhesive.

If an epoxy resin having a naphthalene structure is used, the fluidity can be preferably improved without lowering the glass-transition temperature (Tg) of the cured resin components. Since the glass-transition temperature (Tg) of the cured epoxy resin is high, the thermal and moisture resistances of the connection are improved. A third invention of the present application corresponds to this preferable aspect.

As the curing agent used in the present invention, an already generally known curing agent can be properly selected as the curing agent for the epoxy resin. In particular, if a latent curing agent is used, preservation stability becomes favorably high. The latent curing agent immediately causes a curing reaction under certain conditions set by heating or the like, while it has high storage stability at a low temperature and hardly causes a curing reaction at room temperature. Examples of the latent curing agent include an imidazole-type, a hydrazide-type, amine-types such as a boron trifluoride-amine complex, an amine-imide, a polyamine-type, a tertiary amine, and an alkyl urea, a dicyandiamide, and modified materials thereof. The above-mentioned materials can be used alone or in a mixture of two or more.

Among the above-mentioned latent curing agents, an imidazole-type latent curing agent is preferably used. As the imidazole-type latent curing agent, generally known imidazole-type latent curing agents can be used. Specifically, an adduct of an imidazole compound with an epoxy resin is provided. Examples of the imidazole compound include imidazole, 2-methylimidazole, 2-ethylimidazole, 2-propylimidazole, 2-dodecylimidazole, 2-phenylimidazole, 2-phenyl-4-methylimidazole, and 4-methylimidazole.

Furthermore, a microcapsulated latent curing agent whose particles are coated with high molecular material such as a polyurethane-type or a polyester-type, a metal thin films such as nickel or copper, or an inorganic such as calcium silicate is suitable because the microencapsulated latent curing agent can satisfactorily attain both properties of long-term storage and fast curability, although these two properties are usually incompatible. Therefore, the microcapsulated imidazole-type latent curing agent is particularly preferable.

It is preferable that a blending ratio of the latent curing agent to the epoxy resin and the phenoxy resin is from 5 to 40 wt % relative to the total amount of the epoxy resin and the phenoxy resin. If the ratio of the latent curing agent is smaller than 5 wt %, the curing rate may be reduced and may cause insufficient curing, while if the ratio is larger than 40 wt %, the unreacted curing agent may easily remain and may cause a deterioration of the thermal resistance and the moisture resistance.

An inorganic filler used in the present invention reduces the coefficient of thermal expansion of the anisotropic conductive adhesive and improves the thermal resistance and moisture resistance by lowering water absorption. As the inorganic filler, a silica, a metal oxide such as alumina or titanium oxide, a hydroxide such as aluminum hydroxide, magnesium hydroxide, or calcium hydroxide, or a complex oxide, which is generally known, can be used. If a silica filler is used as the inorganic filler, beneficial effects for reducing the coefficient of thermal expansion and for improving the coefficient of insulation may be preferably exhibited.

The average particle diameter of the inorganic filler is preferably 500 nm or smaller. Since the total surface area of the particles of the inorganic filler becomes larger when the average particle diameter becomes smaller, an interaction with the resin components such as the epoxy resin and the phenoxy resin can be enhanced. As a result, the moisture resistance can be improved with a smaller content of inorganic filler. The lower limitation of the average particle diameter, which is not necessarily limited, is preferably 3 nm or larger from the viewpoint of handling. Furthermore, the average particle diameter of the inorganic filler is preferably 100 nm or smaller because the filler greatly improves the moisture resistance. A fourth invention of the present application corresponds to this preferable aspect. Furthermore, the maximum particle diameter of the inorganic filler is preferably 5 μm or smaller.

As the content of the inorganic filler becomes larger, the water absorption of the adhesive becomes lower, resulting in an improvement of the moisture resistance. If the content of the inorganic filler, however, is excessive, adhesive strength is deteriorated and the fluidity is insufficient under heating and pressing in a connecting treatment, and the problem of lowering connection reliability occurs. Therefore, the content of the inorganic filler is preferably 0.5 wt % to 30 wt % of the total weight of the resin components. More preferably, the content of the inorganic filler is 5 wt % to 20 wt % of the total weight of the resin components.

Examples of the conducting particles used in the present invention include metal particles such as particles of gold, silver, copper, nickel, and alloys thereof, and carbon particles. Particles coated with a metal or indium-tin-oxide (ITO) to form electrically conducting layers on the surfaces of non-conducting nuclei such as glass, ceramics, plastic, or metal oxide nuclei can be also used.

If the ratio of the length to the diameter (aspect ratio) of the conducting particles is five or more, the connection resistance can be lowered without increasing the content of the conducting particles. By using those particles as conducting particles, electrical connection can be satisfactorily achieved and insulation resistance in the surface direction can be preferably kept high. A fifth invention of the present application corresponds to this preferable aspect. The aspect ratio of the conducting particles is directly measured by a method such as an observation under a CCD microscope. If a cross-section of a particle is not circular, the aspect ratio is determined using the maximum length of the cross-section as the diameter. Note that the conducting particles need not necessarily have a linear shape and conducting particles having a slightly bent shape or a branched shape can be used without a problem. In these cases, the aspect ratio is determined using the maximum length of the conducting particles as the length. For conducting particles having an aspect ratio of five or more, commercial needle-like conducting particles can be used. Particles of a needle-like shape formed by stringing many fine metal particles together can also be suitably used. More preferably, the aspect ratio is from 10 to 100. Furthermore, if the diameter of the conducting particles is 1 μm or smaller, the conducting particles preferably can be used to connect so-called fine pitch electrodes.

Examples of metals forming fine metal particles include ferromagnetic elemental metals such as Fe, Ni, and Co, and complex substances including ferromagnetic metals. If a metal having ferromagnetism is used, by the ferromagnetism thereof, the conducting particles are orientated and by applying a magnetic field, which is described below, the conducting particles can be also orientated.

If the anisotropic conductive adhesive is formed into a film and the conducting particles that have the above-mentioned aspect ratio of five or more are oriented in the thickness direction of the film, the anisotropic conduction is preferably enhanced further. A sixth invention of the present application corresponds to this preferable aspect. Note that the orientation in the thickness direction means the condition in which the conducting particles are arranged to orient their longitudinal axis perpendicularly to the surface of the film. A method for orientating the conducting particles in the thickness direction of the film is not particularly limited. For example, in the case that the above-mentioned ferromagnetic conducting particles are used, a suitable method for fixing the orientation of the conducting particles includes the steps of dispersing the conducting particles into a resin solution, applying the obtained dispersion solution on a substrate while a magnetic field is being applied to the substrate in a direction crossing the substrate surface so as to orient the conducting particles, and removing a solvent on the substrate so as to solidify the resin solution.

The content of the conducting particles is chosen to be in the range of 0.01 to 30 vol % relative to the total volume of the anisotropic conductive adhesive. The content is determined with consideration of the intended application. In order to prevent the deterioration of the insulative performance in the surface direction caused by excessively supplied conducting particles, the content of the conducting particles is more preferably 0.01 to 10 vol %.

In the anisotropic conductive adhesive of the present invention, without losing the gist of the present invention, other resins such as a thermosetting resin and a thermoplastic resin can be added as well as the above-mentioned components. Furthermore, additives such as a curing promotor, a polymerization retarder, a sensitizer, a silane coupling agent, a flame retardant, and a thixotropic agent may be contained.

The anisotropic conductive adhesive of the present invention can be obtained by mixing the above-mentioned components. For example, by dissolving the inorganic filler and the conducting particles into a solution including the above-mentioned epoxy resin, phenoxy resin, and latent curing agent in a solvent, a liquid anisotropic conductive adhesive can be obtained. Furthermore, an anisotropic conductive adhesive film can be obtained by applying the dispersion solution to form a thin film using a roll coater or the like, and then removing the solvent by a drying method or the like. The thickness of the film is, not being particularly limited, normally 10 to 50 μm.

ADVANTAGES

The present invention provides an anisotropic conductive adhesive having high connection reliability and superior environment-resistant characteristics. When used to form a connection between electrodes, the anisotropic conductive adhesive of the present invention can provide a satisfactory connection resistance due to high fluidity under heating and pressing during a connecting process. The anisotropic conductive adhesive of the present invention can also provide stable characteristics under an environment of high-temperature-and-high-humidity for a long period, so that the adhesive can be used for applications requiring high reliability.

BEST MODE FOR CARRYING OUT THE INVENTION

Next, the best mode for carrying out the invention is described below with reference to EXAMPLES. The scope of the present invention is not limited by the EXAMPLES.

EXAMPLES

Example 1

(Preparing of coating solution) A coating solution was provided that was composed of a bisphenol-A-type liquid epoxy resin [EPICRON 850, Dainippon Ink and Chemicals, Incorporated] and a naphthalene-type epoxy resin [EPI-CRON 4032D, Dainippon Ink and Chemicals, Incorporated] serving as epoxy resins, a phenoxy resin [PKHJ, Inchem Holdings International Limited] having a glass-transition temperature of 95° C. serving as a phenoxy resin, and a microcapsule-type imidazole-type curing agent [NOVA-CURE HX3941, Asahi Kasei Epoxy Co., LTD] serving as a latent curing agent. These components were mixed with a composition ratio of 30/30/40/30 by weight and dissolved into γ-butyrolactone so as to prepare a resin composition solution having a solid content of 60%. Here, spherical silica particles of 20 nm in average diameter were added in an amount of 5 wt %, as an inorganic filler, to the mixture of the epoxy resin and the phenoxy resin and this resulting mixture was kneaded using three roll mill so as to make a homogeneous solution. Furthermore, as conducting particles, needle-like nickel particles (they were formed in a needle-like shape by stringing together nickel particles of 200 nm in average diameter, and the aspect ratio is from 15 to 55) having a distribution of chain lengths from 1 μm to 8 μm were added to the solid content (resin composition, inorganic filler, and nickel powder) in an amount of 1 vol % and this resulting mixture was agitated by a centrifugal mixer so as to be made homogeneous for use as a coating solution serving as an adhesive.

(Preparing of an anisotropic conductive adhesive) After applying the coating solution, which was prepared in the above-mentioned manner, onto a released polyethylene terephthalate (PET) film using a doctor knife, the coating solution was dried for 30 minutes under a temperature of 65° C. in a magnetic field having a magnetic flux density of 100 mT to form an anisotropic conductive adhesive film having a thickness of 25 μm.

(Evaluation of connection resistance) An IC chip was prepared that was composed of 726 gold-plated bumps of 15 μm in width, 100 μm in length, and 16 μm in height and arrayed with a 15 μm pitch, and a glass substrate composed of 726 ITO electrodes of 20 μm in width and arrayed with a 10 μm pitch. A complex composed of the IC chip and the glass substrate was obtained by disposing the anisotropic conductive adhesive film, which was obtained in the above-mentioned manner, between the IC chip and the circuit board, and performing thermobonding under a pressure of 20 gf applied to every bump for 30 seconds while heating the complex at a temperature of 180° C. An electric resistance of an electrode group composed of adjacent 32 electrodes of the 726 electrodes of the complex and connected via the ITO electrodes, the anisotropic conductive adhesive, and the gold bumps, was measured by a four-terminal method. By dividing the measurement result by 32, the connection resistance per electrode was determined. This evaluation was repeated 10 times so as to calculate the mean value of the connection resistance.

(Thermal resistance and moisture resistance tests) The above-mentioned complex composed of the IC chip and the glass substrate was placed in a temperature-and-humidity-controllable chamber that was set at a temperature of 85° C. and a humidity of 85%. After 200 hours, the complex was taken out of the bath. Then, the average connection resistance was determined again in the same manner as previously described. Table shows the results.

Example 2

An anisotropic conductive adhesive film having a thickness of 25 μm was formed in the same manner as in EXAMPLE 1 except that a phenoxy resin [PKHB, Inchem Holdings International Limited] having a glass-transition temperature of 84° C. was used as a phenoxy resin, and subjected to a connection resistance evaluation and a thermal resistance and moisture resistance test. Table shows the results.

Example 3

An anisotropic conductive adhesive film having a thickness of 25 μm was formed in the same manner as in EXAMPLE 1 except that a phenoxy resin [Epikote 4250, Japan Epoxy Resins Co., Ltd.] having a glass-transition temperature of 78° C. was used as a phenoxy resin, and subjected to a connection resistance evaluation and a thermal resistance and moisture resistance test. Table shows the results.

Comparative Example 1

An anisotropic conductive adhesive film having a thickness of 25 μm was formed in the same manner as in EXAMPLE 1 except that a phenoxy resin [Epikote 4256, Japan Epoxy Resins Co., Ltd.] having a glass-transition temperature of 65° C. was used as the phenoxy resin, and subjected to a connection resistance evaluation and a thermal resistance and moisture resistance test. Table shows the results.

Comparative Example 2

An anisotropic conductive adhesive film having a thickness of 25 μm was formed in the same manner as in EXAMPLE 1 except that a phenoxy resin [Epikote 5580, Japan Epoxy Resins Co., Ltd.] having a glass-transition temperature of 110° C. was used as a phenoxy resin, and subjected to a connection resistance evaluation and a thermal resistance and moisture resistance test. Table shows the results.

TABLE

| | Connection resistance (Initial) | Connection resistance (After thermal and moisture resistances test) | Increase rate of resistance (After test/initial) |
|---|---|---|---|
| Example 1 | 1.3 Ω | 8.7 Ω | 6.7 |
| Example 2 | 1.2 Ω | 7.9 Ω | 6.6 |
| Example 3 | 0.9 Ω | 6.3 Ω | 7.0 |
| Comparative example 1 | 0.9 Ω | 12 Ω | 13 |
| Comparative example 2 | 2.6 Ω | 47 Ω | 18 |

The results shown in Table means that if the anisotropic conductive adhesive of the present invention (EXAMPLES) is used, an initial connection resistance is low and an increase of the connection resistance after being exposed for a long time under a high-temperature-and-high-humidity environment is small so as to achieve a superior thermal resistance and a superior moisture resistance. In contrast, according to COMPARATIVE EXAMPLE 1 in which a phenoxy resin having a low glass-transition temperature was used, the rate of increase of the connection resistance after the thermal resistance and moisture resistance test was large although the initial connection resistance was low. This shows a disadvantage of COMPARATIVE EXAMPLE 1 in terms of thermal resistance and moisture resistance. Furthermore, according to COMPARATIVE EXAMPLE 2 in which a phenoxy resin having a high glass-transition temperature was used, the initial connection resistance was high and the rate of increase of the resistance was high. This result may be caused by a low fluidity in the bonding process. These results show that a superior connection performance, thermal resistance, and moisture resistance can be achieved when the anisotropic conductive adhesive according to EXAMPLES of the present invention is used.

The invention claimed is:

1. An anisotropic conductive adhesive comprising:
   an epoxy resin;
   a phenoxy resin;
   a curing agent;
   an inorganic filler; and
   conducting particles, wherein
      the glass-transition temperature (Tg) of the phenoxy resin is in the range of 66° C. to 100° C.,
      the average diameter of particles of the inorganic filler is 100 nm or smaller, and
      the content of the inorganic filler is 0.5 wt % to 30 wt % of the total weight of the epoxy and phenoxy resin components.

2. The anisotropic conductive adhesive according to claim 1, wherein the content of the phenoxy resin is in the range of 5 wt % to 60 wt % of the total weight of resin components.

3. The anisotropic conductive adhesive according to claim 1, wherein the epoxy resin includes an epoxy resin having a naphthalene structure.

4. The anisotropic conductive adhesive according to claim 1, wherein the ratio of length to diameter (aspect ratio) of the conducting particles is five or more.

5. The anisotropic conductive adhesive according to claim 4, wherein the anisotropic conductive adhesive has the form of a film and the conducting particles are oriented in the thickness direction of the film.

* * * * *